United States Patent [19]

Toyooka et al.

[11] 4,379,341
[45] Apr. 5, 1983

[54] SERIES RESONANCE DRIVE CIRCUIT FOR MAGNETIC BUBBLE MEMORY

[75] Inventors: Takashi Toyooka; Mamoru Sugie, both of Sayama; Hirokazu Aoki, Hachioji; Shigeru Yoshizawa, Tokorozawa, all of Japan

[73] Assignee: Hitachi, Ltd., Tokyo, Japan

[21] Appl. No.: 303,527

[22] Filed: Sep. 18, 1981

[30] Foreign Application Priority Data

Sep. 19, 1980 [JP] Japan .................. 55-129329

[51] Int. Cl.³ .............................. G11C 19/08
[52] U.S. Cl. .................................... 365/6
[58] Field of Search .......................... 365/6

[56] References Cited

U.S. PATENT DOCUMENTS

| | | | |
|---|---|---|---|
| 3,720,883 | 3/1973 | Hess, Jr. et al. | 365/6 |
| 3,763,478 | 10/1973 | Yoshizawa et al. | 365/6 |
| 3,946,373 | 3/1976 | Moolenbeek et al. | 365/6 |
| 3,972,036 | 7/1976 | Navratil | 365/6 |

Primary Examiner—James W. Moffitt
Attorney, Agent, or Firm—Antonelli, Terry & Wands

[57] ABSTRACT

A series resonance drive circuit for a magnetic bubble memory comprises a magnetic bubble memory chip or chips, X and Y coils arranged orthogonally to each other to form a rotating magnetic field in a plane of the chip or chips, resonance capacitors connected in series with the X and Y coils to form series resonance circuits with the X and Y coils at a frequency of the rotating magnetic field, A.C. power supplies connected to the resonance circuit, and a reactance device connected to the resonance circuits to compensate a mutual inductance due to a mutual inductive coupling between the X and Y coils and a capacitance due to a capacitive coupling between the X and Y coils. The reactance device includes a mutual inductance device, or an inductance device and a capacitance device.

7 Claims, 11 Drawing Figures

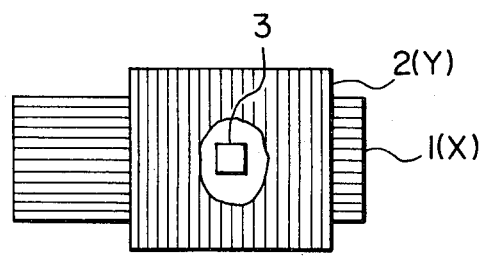
FIG. 1 PRIOR ART
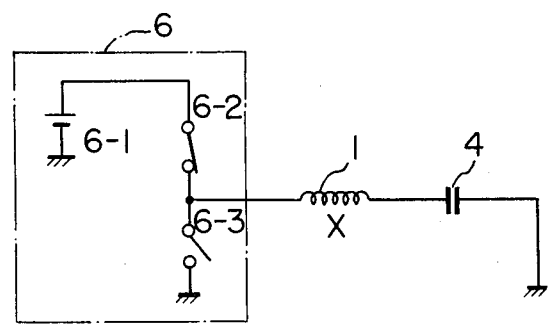
FIG. 2 PRIOR ART
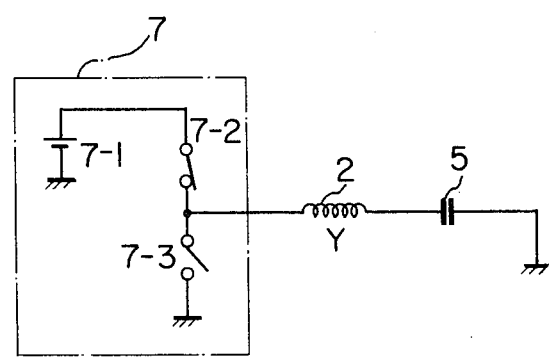

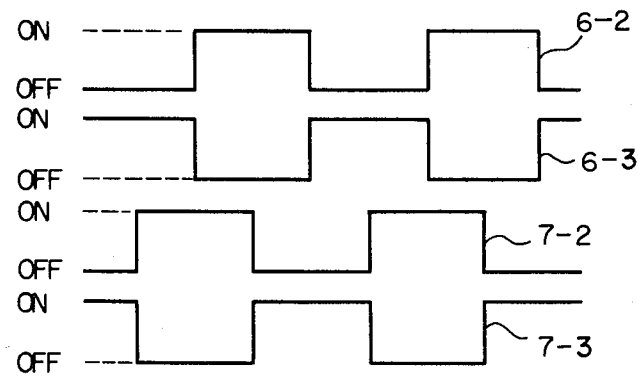
FIG. 3 PRIOR ART
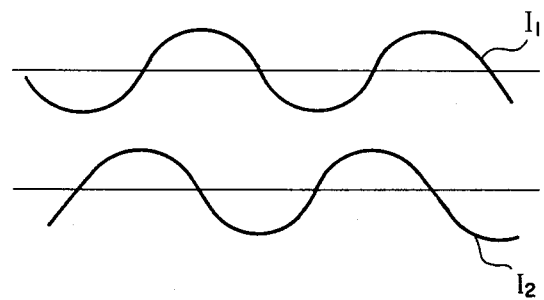
FIG. 4
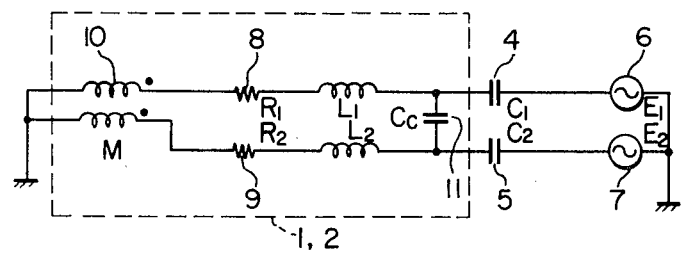

SERIES RESONANCE DRIVE CIRCUIT FOR MAGNETIC BUBBLE MEMORY

The present invention relates to a magnetic bubble memory, and more particularly to an improvement in a performance of a series resonance drive circuit for a magnetic bubble memory for generating a rotating magnetic field.

A magnetic bubble memory has been well known in the art. Such a magnetic bubble memory usually comprises a magnetic bubble memory chip constructed to move magnetic bubbles in accordance with a rotating magnetic field, a magnetic bias field device for maintaining the magnetic bubbles at a constant size and a rotating magnetic field generating device for generating the rotating magnetic field. Of those, the rotating magnetic field generating device generates the rotating magnetic field in a plane of a magnetic bubble chip 3, shown in FIG. 1, disposed within an X coil 1 and Y coil 2 which are arranged orthogonally to each other by supplying currents having a phase difference of 90 degrees such as sinusoidal wave, triangular wave or trapezoidal wave.

Various rotating magnetic field generators have been proposed so far. As one example thereof, a series resonance drive circuit for the magnetic bubble memory has been proposed by the present assignee. (See U.S. Pat. No. 3,763,478 dated Oct. 2, 1973 corresponding to Japanese Patent Publication No. 50-34381 entitled "Series Resonance Drive Circuit for Magnetic Bubble Memory.") In the proposed series resonance drive circuit, resonance circuits formed by connecting a resonance capacitor 4 (FIG. 2) in series with the X coil 1 and a resonance capacitor 5 in series with the Y coil 2. Those resonance circuits are connected to drive sources 6 and 7, respectively. The drive sources 6 and 7 comprise D.C. power supplies 6-1 and 7-1, and switching devices 6-2, 6-3 and 7-2, 7-3, respectively. The switching devices 6-2, 6-3 and 7-2, 7-3 are turned on and off as shown in a time chart of FIG. 3. Through the switching operations of the switching devices 6-2, 6-3 and 7-2, 7-3 in the drive sources 6 and 7, sinusoidal wave currents $I_1$ and $I_2$ having a phase difference of 90 degrees flow through the X coil and the Y coil 2, respectively. The series resonance drive circuit for the magnetic bubble memory is characterized by a very small power dissipation to compare with a direct drive of the coils. As a result, the drive source circuits can be simplified and the cost thereof can be reduced.

However, when a magnetic bubble memory was manufactured using such a series resonance drive circuit and the rotating magnetic field was generated to operate the magnetic bubble memory, the following problem was encountered. The locus of the rotating magnetic field, which should be circular, is substantially deformed to be oval, which corresponds to the rotating magnetic field variation according to the rotating field direction. This significantly reduces a bias field margin in bubble transfer. In addition, even the magnetic bubble memories manufactured in the same batch have a variation in the strength of the rotating magnetic field, which reduces a reliability of the memory. The direction dependence of rotating magnetic field strength increases as the frequency of the rotating magnetic field becomes higher. Consequently, certain measures have been desired.

It is, therefore, an object of the present invention to provide a series resonance coil driver for a magnetic bubble memory which can correct the strength of the rotating magnetic field to a constant level independently of the direction.

In order to achieve the above object, in accordance with the present invention, it has been noted that the direction dependence of the strength of the rotating magnetic field was caused by variances in the X and Y coil currents due to a capacitive coupling between the X and Y coils and an inductive coupling between the X and Y coils, and the present series resonance drive circuit comprises reactance devices for cancelling those couplings which are connected electrically to the resonance circuits.

With the characteristic feature of the present invention, the capacitive coupling and the inductive coupling effect between the X and Y coils can be substantially compensated so that the currents flowing through the X and Y coils are substantially equalized and the direction dependence of the strength of the rotating magnetic field is reduced.

The present invention will be explained in detail with reference to the accompanying drawings.

FIG. 1 shows an arrangement of X and Y coils in a magnetic bubble memory;

FIGS. 2 and 3 show a basic configuration of a series resonance drive circuit for the magnetic bubble memory and a time chart for explaining the operation thereof, respectively;

FIGS. 4 to 6 show an equivalent circuit for a series resonance drive circuit for the magnetic bubble memory for explaining a principle of the present invention and graphs showing characteristics thereof;

Figure 5:
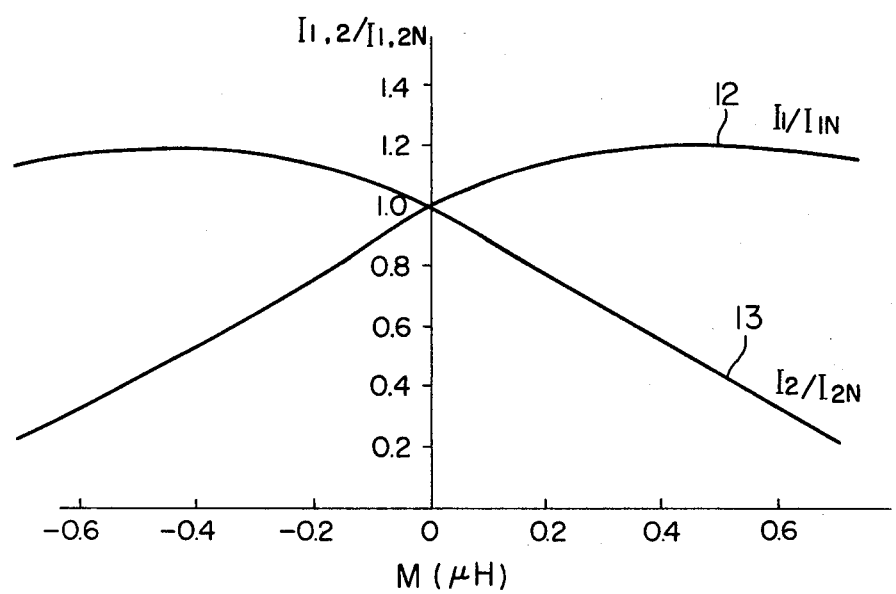

Before explaining the preferred embodiments of the present invention, the capacitive coupling and the inductive coupling between the X and Y coils are first discussed and then the effect of those couplings to the series resonance drive circuit for the magnetic bubble memory is considered.

As explained above in connection with FIG. 1, the X and Y coils 1 and 2 are arranged in the magnetic bubble memory to be orthogonal to each other with the X coil 1 being disposed within the Y coil 2. Since the X and Y coils 1 and 2 are arranged closely to each other, a coupling capacitance $C_c$ exists between the windings thereof. If the X and Y coils 1 and 2 are not mounted perfectly perpendicularly to each other, a mutual inductance M exists between the coils. An equivalent circuit of the series resonance drive circuit for driving the X and Y coils 1 and 2 having the coupling capacitance $C_c$ and the mutual inductance M is shown in FIG. 4. Since the sinusoidal wave constant voltage sources 6 and 7 have a phase difference of 90 degrees therebetween, a drive voltage of the voltage source 6 is expressed by $\dot{E}_1$ (sinusoidal voltage in complex expression) and a drive voltage of the voltage source 7 is expressed by $j\dot{E}_2$, where the drive voltage $\dot{E}_1$ and $\dot{E}_2$ are sinusoidal waves of the same amplitude. Numerals 4 and 5 denote resonance capacitors of the resonance circuits, and $C_1$ and $C_2$ denote capacitances. Numerals 8 and 9 denote dissipation resistances of the X and Y coils 1 and 2, respectively, having resistances of $R_1$ and $R_2$. Numeral 10 denotes the mutual inductance M and numeral 11 denotes the coupling capacitance $C_c$ between the coils. The current $I_1$ which flows in the X coil 1 of the equivalent circuit and the current $jI_2$ which flows in the Y coil 2 (both currents are in complex expression have the following relations with the voltages $E_1$ and $E_2$, where $L_1$ and $L_2$ represent the inductances of the X and Y coils 1 and 2, respectively.

$$E_1 = \left[ j\omega L_1 + \frac{1}{j\omega C_1} + R_1 + \frac{C_c}{C_1} \{j\omega(L_1 - M) + R_1\} \right] I_1 + \tag{1}$$

$$\left[ j\omega M - \frac{C_c}{C} \{j\omega(L_2 - M) + R_2\} \right] jI_2$$

$$jE_2 = \tag{2}$$

$$\left[ j\omega L_2 + \frac{1}{j\omega C_2} + R_2 + \frac{C_c}{C_2} \{j\omega(L_2 - M) + R_2\} \right] jI_2 +$$

$$\left[ j\omega M - \frac{C_c}{C_2} \{j\omega(L_1 - M) + R_1\} \right] I_1$$

The conditions for the series resonance are given by the formulas (3) and (4):

$$j\omega L_1 + \frac{1}{j\omega C_1} + j\omega \frac{C_c}{C_1} (L_1 - M) = 0 \tag{3}$$

$$j\omega L_2 + \frac{1}{j\omega C_2} + j\omega \frac{C_c}{C_2} (L_2 - M) = 0 \tag{4}$$

Accordingly, $$E_1 = \left( 1 + \frac{C_c}{C_1} \right) R_1 I_1 + \tag{5}$$

$$\left[ j\omega \left( \left( 1 + \frac{C_c}{C_1} \right) M - \frac{C_c}{C_1} L_2 \right) - \frac{C_c R_2}{C_1} \right] jI_2$$

$$jE_2 = \left( 1 + \frac{C_c}{C_2} \right) jR_2 I_2 + \tag{6}$$

$$\left[ j\omega \left( \left( 1 + \frac{C_c}{C_2} \right) M - \frac{C_c}{C_2} L_1 \right) - \frac{C_c R_1}{C_2} \right] I_1$$

Since the coupling capacitance $C_c$ between the coils in sufficiently smaller than the capacitances $C_1$ and $C_2$ of the resonance capacitors, and hence $$\frac{C_c}{C_1}, \frac{C_c}{C_2} << 1,$$

$$\left( 1 + \frac{C_c}{C_1} \right) \simeq 1 \tag{7}$$

$$\left( 1 + \frac{C_c}{C_2} \right) \simeq 1 \tag{8}$$

the following relations are met when the coils have sufficiently high Q ($Q \geqq 20$):

$$|j\omega L_2| >> R_2 \tag{9}$$
$$|j\omega L_1| >> R_1 \tag{10}$$

Accordingly, the formulas (5) and (6) can be expressed as follows $$E_1 = \left( 1 + \frac{C_c}{C_1} \right) R_1 I_1 - \omega \left( M - \frac{C_c}{C_1} L_2 \right) I_2 \tag{11}$$

$$E_2 = \left( 1 + \frac{C_c}{C_2} \right) R_2 I_2 + \omega \left( M - \frac{C_c}{C_2} L_1 \right) I_1 \tag{12}$$

from the formulas (11) and (12), $I_1$ and $I_2$ are determined as follows:

$$I_1 = \frac{\left( 1 + \frac{C_c}{C_2} \right) R_2 \cdot E_1 + \omega \left( M - \frac{C_c}{C_1} L_2 \right) E_2}{\left( 1 + \frac{C_c}{C_1} \right) \left( 1 + \frac{C_c}{C_2} \right) R_1 R_2 + \omega^2 \left( M - \frac{C_c}{C_1} L_2 \right) \left( M - \frac{C_c}{C_2} L_1 \right)} \tag{13}$$

$$I_2 = \frac{-\omega \left( M - \frac{C_c}{C_2} L_1 \right) E_1 + \left( 1 + \frac{C_c}{C_1} \right) R_1 E_2}{\left( 1 + \frac{C_c}{C_1} \right) \left( 1 + \frac{C_c}{C_2} \right) R_1 R_2 + \omega^2 \left( M - \frac{C_c}{C_1} L_2 \right) \left( M - \frac{C_c}{C_2} L_1 \right)} \tag{14}$$

If the couplings by the coupling capacitance $C_c$ and the mutual inductance M do not exist, the coil currents $I_1$ and $I_2$ are expressed as follows by putting $C_c = M = 0$ in the formulas (13) and (14).

$$I_1 = \frac{E_1}{R_1} \tag{15}$$

$$I_2 = \frac{E_2}{R_2} \tag{16}$$

Under this condition, the amplitudes of the currents $\dot{I}_1$ and $\dot{I}_2$ following in the X coil 1 and the Y coil 2 are determined only by the dissipation resistances $R_1$ and $R_2$ of the respective coils and the drive voltage $E_1$ and $E_2$.

In a system where only the mutual inductance M exists between the X and Y coils 1 and 2, the currents $I_1$ and $I_2$ are expressed as follows by putting $C_c = 0$ in the formulas (13) and (14).

$$I_1 = \frac{1}{1 + \frac{\omega^2 M^2}{R_1 R_2}} \left( \frac{\dot{E}_1}{R_1} + \frac{\omega M}{R_1 R_2} \dot{E}_2 \right) \quad (17)$$

$$I_2 = \frac{1}{1 + \frac{\omega^2 M^2}{R_1 R_2}} \left( -\frac{\omega M}{R_1 R_2} \dot{E}_1 + \frac{\dot{E}_2}{R_2} \right) \quad (18)$$

By way of example, when the X and Y coils 1 and 2 are driven at the frequency of 300 KHz and when $L_1 = L_2 = 50$ μH, $R_1 = R_2 = 20\Omega$, $M = 0.5$ μH and $\omega = 2\pi \times (3 \times 10^5)$, the currents $\dot{I}_1$ and $\dot{I}_2$ are determined as follows. The mutual inductance M of 0.5 μH corresponds to that the angle between the X and Y coils 1 and 2 is deviated by 0.57 degree from a right angle or 90 degrees. The $\theta$'s of the X and Y coils 1 and 2 are assumed to be 47. Then, the formulas (17) and (18) are expressed as follows:

$$\dot{I}_1 = \frac{1}{1.22} \{0.5 \dot{E}_1 + 0.24 \dot{E}_2\} \quad (19)$$

$$\dot{I}_2 = \frac{1}{1.22} \{-0.24 \dot{E}_1 + 0.5 \dot{E}_2\} \quad (20)$$

If $|\dot{E}_1| = |\dot{E}_2|$, then $$|\dot{I}_1| = 0.61 |\dot{E}_1| \quad (21)$$

$$|\dot{I}_2| = 0.21 |\dot{E}_2| \quad (22)$$

Comparing the formulas (21) and (22) with the formulas (15) and (16) where $R_1$ and $R_2$ are put to $2\Omega$, $|\dot{I}_1|$ is increased by 22% while $|\dot{I}_2|$ is decreased by 58%. The normalized values of the amplitudes of the currents when the mutual inductance M varies from $-0.6$ to $+0.6$ μH are shown in FIG. 5, in which curves 12 and 13 represent the changes of ratios $I_1/I_{1N}$ and $I_2/I_{2N}$, where $I_{1N}$ and $I_{2N}$ are the amplitudes of the currents flowing through the X and Y coils when the mutual inductance M is zero and $I_1$ and $I_2$ are the amplitudes of the currents actually flowing through the X and Y coils. As seen from the curves 12 and 13, when the mutual inductance M slightly changes, that is, when the angle between the X and Y coils 1 and 2 slightly deviates from 90 degrees, the currents flowing through the X and Y coils 1 and 2 change significantly.

In an actual magnetic bubble memory, it is assumed that the angle $\theta$ between the X and Y coils 1 and 2 which are to be arranged orthogonally to each other varies within a range of 90°±0.5°. Then, the mutual inductance M is determined by the following formula:

$$M = \sqrt{L_1 L_2} \sin(\theta - 90°) \quad (23)$$

By substituting the angle $\theta$, the formula (23) is expressed as follows:

$$-8.8 \times 10^{-3} \leq \frac{M}{\sqrt{L_1 L_2}} \leq 8.8 \times 10^{-3} \quad (24)$$

Since $L_1 = L_2 = 50$ μH in the X and Y coils 1 and 2, the formula (24) is expressed as follows:

$$-0.44 \ \mu H \leq M \leq 0.44 \ \mu H \quad (25)$$

From FIG. 5, the deviations of the ratios $I_1/I_{1N}$ and $I_2/I_{2N}$ are determined as follows:

$$0.5 \leq I_1/I_{1N}, I_2/I_{2N} \leq 1.2 \quad (26)$$

Accordingly, in the drive circuit having the frequency of 300 KHz, it is seen that the variance of the currents flowing through X and Y coils 1 and 2 due to the presence of the mutual inductive coupling (M) between the X and Y coils 1 and 2 is very large. This fact, that is, the difference between the amplitudes of the currents flowing through X and Y coils 1 and 2 means that a locus of the rotating magnetic field does not draw a circle and consequently the magnetic bubbles cannot be moved stably because the strength of the magnetic field changes depending on the direction. The effect on the current flowing through the X and Y coils 1 and 2 when the capacitive coupling $C_c$ only exists between the X and Y coils 1 and 2 is now discussed. By putting $M = 0$ in the formulas (13) and (14), we get $$\dot{I}_1 = \frac{\left(1 + \frac{C_c}{C_2}\right) R_2 \dot{E}_1 - \omega \frac{C_c}{C_1} L_2 \dot{E}_2}{\left(1 + \frac{C_c}{C_1}\right)\left(1 + \frac{C_c}{C_2}\right) R_1 R_2 + \omega^2 \frac{C_c^2}{C_1 C_2} L_1 L_2} \quad (27)$$

$$\dot{I}_2 = \frac{\left(1 + \frac{C_c}{C_1}\right) R_1 \dot{E}_2 + \omega \frac{C_c}{C_2} L_1 \dot{E}_2}{\left(1 + \frac{C_c}{C_1}\right)\left(1 + \frac{C_c}{C_1}\right) R_1 R_2 + \omega^2 \frac{C_c^2}{C_1 C_2} L_1 L_2} \quad (28)$$

Figure 6:
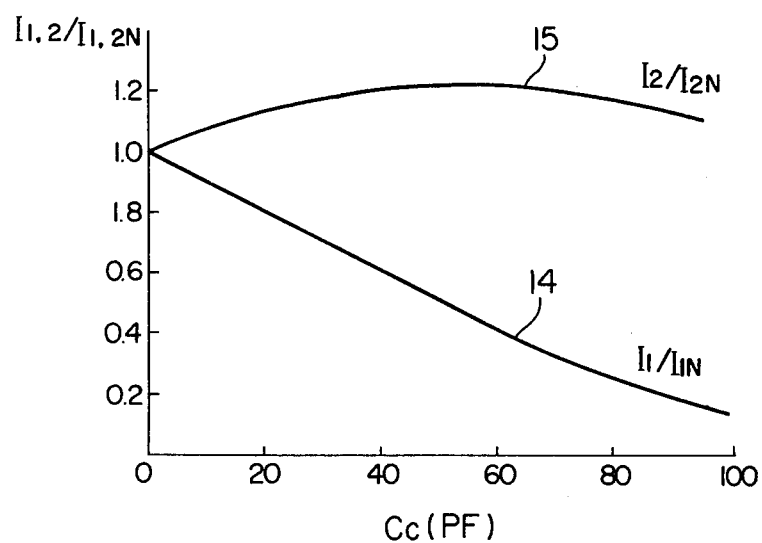

Let us assume that the X and Y coils 1 and 2 having $L_1 = L_2 + 50$ μH and $R_1 = R_2 = 20\Omega$ are driven at 300 KHz drive frequency. The capacitances $C_1$ and $C_2$ of the resonance capacitors 4 and 5 are 5620 pF. The changes of the currents $I_1$ and $I_2$ flowing through the X and Y coils 1 and 2 when the coupling capacitance $C_c$ between the X and Y coils 1 and 2 is changed from 0 to 100 pF are shown by curves 14 and 15 in FIG. 6. The currents $I_1$ and $I_2$ are normalized by the currents $I_{1N}$ and $I_{2N}$ flowing through the X and Y coils 1 and 2 when the coupling capacitance $C_c$ is zero, as is the case of FIG. 5. Thus, the curve 14 represents the change of the ratio $I_1/I_{1N}$ and the curve 15 represents the change of the ratio $I_2/I_{2N}$. It is seen from the curves 14 and 15 that the current $I_1$ flowing through the X coil 1 decreases and the current $I_2$ flowing through the Y coil 2 increases as the capacitive coupling $C_c$ increases. When the capacitive coupling $C_c$ is 50 pF, the current $I_1$ decreases by 50% and the current $I_2$ increases by 20%. This fact indicates that, like in the case of the mutual inductance coupling (M), the currents $I_1$ and $I_2$ flowing through the X and Y coils 1 and 2 under a given drive condition are varied by the variance of the capacitive coupling $C_c$. As a result, the circular locus of the rotating magnetic field formed by the X and Y coils 1 and 2 is significantly distorted and the stable movement of the magnetic bubbles is not realized.

In addition, when the variances are included in the currents flowing through the X and Y coils 1 and 2 due to the inductive coupling and the capacitive coupling between the X and Y coils, the voltages of the power supply of the series resonance driver must be adjusted respectively for each of the X and Y coils. This is troublesome. It is not possible to drive a plurality of one-chip devices each having the magnetic bubble memory on one magnetic bubble memory chip, by one power supply voltage.

In order to overcome the above difficulties, the series resonance drive circuit for the magnetic bubble memory is necessary to be composed by using reactance devices in the resonance circuits.

The present series resonance drive circuit for the magnetic bubble memory constructed in accordance with the experimental consideration described above is now explained in conjunction with the preferred embodiments.

EMBODIMENT 1

Figure 7:
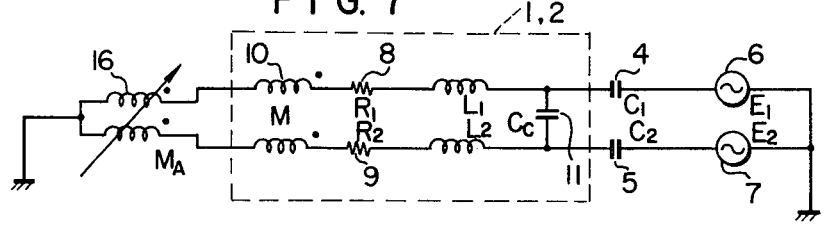
FIGS. 7 to 9 show an equivalent circuit for the series resonance drive circuit for the magnetic bubble memory of the present invention, an equivalent circuit of a variable inductance device used for the compensation and a structure thereof, respectively.
Figure 8:
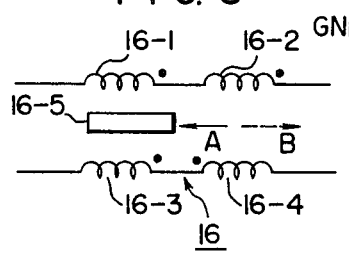
Figure 9:
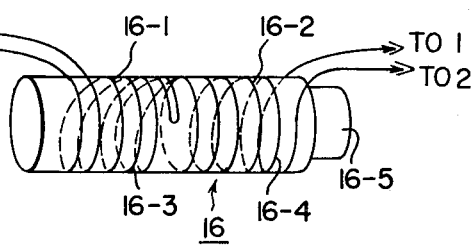

FIG. 7 shows an equivalent circuit of the series resonance drive circuit in accordance with the present invention. A difference between the present equivalent circuit and the equivalent circuit shown in FIG. 4 resides in that a reactance device 16 having a variable mutual inductance of inductive coupling is connected between the X and Y coils 1 and 2 and ground. A detailed equivalent circuit and a specific structure of the mutual inductance device 16 are shown in FIGS. 8 and 9. Primary windings 16-1 and 16-2 are wound in series in the same direction. The numbers of turns of the primary windings 16-1 and 16-2 are equal. On the other hand, a secondary winding 16-3 is wound in the same direction as the primary winding 16-1 while a secondary winding 16-4 is wound in the opposite direction to the primary winding 16-2. As shown in FIGS. 8 and 9, a movable core 16-5 is inserted into the windings 16-1 4. The windings 16-1 and 16-3 have a positive mutual coupling and the windings 16-2 and 16-4 have a negative mutual coupling. As the movable core 16-5 is moved toward the windings 16-1 and 16-3 as shown by an arrow A, a coupling coefficient between the winding 16-1 and 16-3 increases while a coupling coefficient between the winding 16-2 and 16-4 decreases. As a result, the mutual inductive coupling between the primary winding and the secondary winding changes to be positive. As the movable core 16-5 is moved to the right as shown by an arrow B, the coupling coefficient between the windings 16-1 and 16-3 is decreased and the coupling coefficient between the windings 16-2 and 16-4 are increased so that the mutual inductive coupling gradually decreases. When the movable core 16-5 is moved to the mid-point between the windings 16-1, 16-2 and the windings 16-3, 16-4, the mutual inductive coupling between the windings 16-1 and 16-3 and the mutual inductive coupling between the windings 16-2 and 16-4 are equal in their absolute values and opposite in their signs. Accordingly, a total mutual inductive coupling is zero. When the movable core 16-5 is further moved to the right as shown by the arrow B, the coupling coefficient between the windings 16-2 and 16-4 becomes larger than the coupling coefficient between the windings 16-1 and 16-3 so that the mutual inductive coupling changes to be negative. When the mutual inductive coupling of the mutual inductance device 16 is given by $M_A$, the formulas (11) and (12) are represented as follows:

$$\dot{E}_1 = \left(1 + \frac{C_c}{C_1}\right) R_1 \dot{I}_1 - \omega \left(M + M_A - \frac{C_c}{C_1} L_2\right) \dot{I}_2 \quad (28)$$

$$\dot{E}_2 = \left(1 + \frac{C_c}{C_2}\right) R_2 \dot{I}_2 + \omega \left(M + M_A - \frac{C_c}{C_2} L_1\right) \dot{I}_1 \quad (29)$$

In the formulas (28) and (29), $L_2/C_1$ and $L_1/C_2$ are equal because of the condition of series resonance. Accordingly, if $$M + M_A - \frac{C_c}{C_1} L_2 = 0 \quad (30)$$

then the coefficients of $\dot{I}_2$ and $\dot{I}_1$ in the formulas (28) and (29) are zero. As a result, the variances of the currents flowing through the X and Y coils 1 and 2 due to the mutual inductance M and the coupling capacitance $C_c$ between the X and Y coils 1 and 2 are affected only by the terms $C_c/C_1$ and $C_c/C_2$, as shown by the following formulas:

$$\dot{I}_1 = \frac{1}{\left(1 + \frac{C_c}{C_1}\right) R_1} \dot{E}_1 \quad (31)$$

$$\dot{I}_2 = \frac{1}{\left(1 + \frac{C_c}{C_2}\right) R_2} \dot{E}_2 \quad (32)$$

In an actual magnetic bubble memory device, the variance of the coupling capacitance $C_c$ is in the order of 30 pF. If the capacitances of the resonant capacitors 4 and 5 are 5000 pF as described above, the variance is in the order of ±0.3% which is too small to raise a problem by those terms.

Accordingly, by selecting the mutual inductive coupling $M_A$ of the mutual inductance device 16 such that the formula (30) assumes zero, the variances of the currents flowing through the X and Y coils 1 and 2 are reduced to be sufficiently small.

As a result, the locus of the rotating magnetic field formed by the X and Y coils 1 and 2 is substantially circular and the direction dependence of the strength of the magnetic field is essentially compensated.

EMBODIMENT 2

Figure 10:
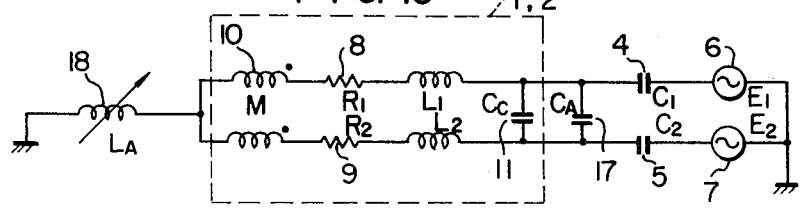
FIGS. 10 and 11 show equivalent circuits of other embodiments of the present invention.

FIG. 10 shows an equivalent circuit of another series resonance drive circuit in accordance with the present invention. A difference from the embodiment 1 shown in FIG. 7 resides in that the variable mutual inductance device 16 of FIG. 17 is replaced by a simple variable inductance device 18 and a capacitor 17 to attain the same effect as the embodiment 1 does. As shown in FIG. 10, the ground terminals of the X and Y coils 1 and 2 are connected together and the variable inductance device 18 is inserted between the junction of the X and Y coils 1 and 2 and ground (power supply). The capacitor 17 is connected between the junction of the X coil 1 and the resonant capacitor 4 and the junction of the Y coil 2 and the resonant capacitor 5. When the inductance of the variable inductance device 18 is given by $L_A$ and the capacitance of the capacitor 17 is given by $C_A$, the formulas (11) and (12) are represented as follows:

$$E_1 = \left(1 + \frac{C_c + C_A}{C_1}\right) R_1 I_1 - \qquad (33)$$

$$\omega \left(M + L_A - \frac{C_c + C_A}{C_1} L_2\right) I_2$$

$$E_2 = \left(1 + \frac{C_c + C_A}{C_1}\right) R_2 I_2 - \qquad (34)$$

$$\omega \left(M - L_A - \frac{C_c + C_A}{C_2} L_1\right) I_1$$

Like in the embodiment 1, the inductance $L_A$ is selected such that the following formula is met:

$$M + L_A - \frac{C_c + C_A}{C_1} L_2 = 0 \qquad (35)$$

When $L_2 = 50$ μH, $C_1 = 5600$ pF, $-1$ μH $\leq M \leq 1$ μH, and 50 pF $\leq C_c \leq 90$ pF, then the formula (35) is represented as follows:

$$-0.55 \text{ μH} \leq M - \frac{C_c}{C_1} L_2 = L_A - \frac{C_A}{C_1} L_2 \leq 1.80 \text{ μH} \qquad (36)$$

When the inductance $L_A$ varies within a range of 2 μH ~ 5 μH and $C_A = 330$ pF, the formula (35) is met by adjusting the inductance $L_A$ such that the following relation is met:

$$-0.9 \text{ μH} \leq L_A - \frac{C_A}{C_1} L_2 \leq 2.1 \text{ μH} \qquad (37)$$

as a result, the variances of the currents flowing through the X and Y coils 1 and 2 are rendered to be sufficiently small. Consequently, the locus of the rotating magnetic field formed by the X and Y coils 1 and 2 is substantially circular and the direction dependence of the strength of the magnetic field is essentially compensated.

EMBODIMENT 3

Figure 11:
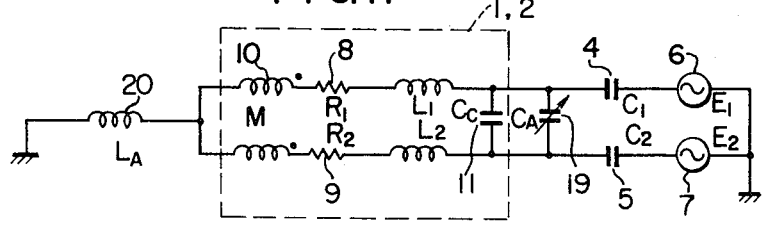

FIG. 11 shows an equivalent circuit of a further series resonance drive circuit in accordance with the present invention. A difference from the embodiment 1 shown in FIG. 7 resides in that the variable inductance device 16 of the embodiment 1 is replaced by a variable capacitor 19 and a fixed inductance device 20 to attain the same effect as the embodiment 1 does. As shown in FIg. 11, the ground terminals of the X and Y coils 1 and 2 are connected together and the fixed inductance device 20 is inserted between the junction of the X and Y coils 1 and 2 and ground (power supply). The variable capacitor 19 is connected between the junction of the X coil 1 and the resonance capacitor 4 and the junction of the Y coil 2 and the resonance capacitor 5. When the inductance of the fixed inductance device 20 is given by $L_A$ and the capacitance of the variable capacitor 19 is given by $C_A$, the formulas (11) and (12) are represented by the formulas (33) and (35), and the condition to be met is represented by the formula (35). When $L_2 = 50$ μH, $C_1 = 5600$ pF, $-1$ μH $\leq M \leq 1$ μH, and 50 pF $\leq C_c \leq 90$ pF, then the formula (35) is represented as follows:

$$-0.55 \text{ μH} \leq L_A - \frac{C_A}{C_1} L_2 \leq 1.80 \text{ μH} \qquad (38)$$

If $L_A = 2.2$ μH, then $$45 \text{ pF} \leq C_A \leq 308 \text{ pF} \qquad (39)$$

Accordingly, the formula (35) is met by the variable capacitor 19 having a variable range defined by the formula (39). As a result, the variances of the currents flowing through the X and Y coils 1 and 2 are reduced to be sufficiently small. Consequently, the locus of the rotating magnetic field formed by the X and Y coils 1 and 2 is substantially circular and the direction dependence of the strength of the magnetic field is essentially compensated.

It should be understood that the variable reactance devices in the above embodiments may be replaced by fixed reactance devices after the optimum values thereof have been determined.

As described hereinabove, in accordance with the present series resonance drive circuit for the magnetic bubble memory, the mutual inductive coupling and the capacitive coupling between the X and Y coils for generating the rotating magnetic field are compensated so that the variances of the currents flowing through the X and Y coils are rendered to be very small. Consequently, the locus of the rotating magnetic field is circular at a high drive frequency and a high quality of magnetic bubble memory is provided.

What is claimed is:

1. A series resonance drive circuit for a magnetic bubble memory, comprising:
    (a) a magnetic bubble memory chip or chips in which magnetic bubbles are driven in accordance with a rotating magnetic filed;
    (b) X and Y coils arranged orthogonally to each other to generate said rotating magnetic field in a plane of said magnetic bubble memory chip or chips;
    (c) resonance capacitors each connected in series with respective one of said X and Y coils to form a series resonance circuit with the respective one of said X and Y coils at a frequency of said rotating magnetic field;
    (d) power supplies each connected to the respective one of said resonance circuits to supply a cyclic wave current containing only an A.C. component to the respective one of said resonance circuits; and
    (e) a reactance device connected to said resonance circuits to compensate a mutual inductance due to a mutual inductive coupling between said X and Y coils and a capacitance due to a capacitive coupling between said X and Y coils.

2. A series resonance drive circuit for a magnetic bubble memory according to claim 1, wherein said reactance device is a mutual inductance device electrically connected between said resonance circuits.

3. A series resonance drive circuit for a magnetic bubble memory according to claim 2, wherein said mutual inductance device includes an inductance varying means to vary the mutual inductance.

4. A series resonance drive circuit for a magnetic bubble memory according to claim 1, wherein said reactance device includes an inductance device electrically connected to a junction of said X and Y coils and said power supplies, and a capacitance device connected between said resonance circuits.

5. A series resonance drive circuit for a magnetic bubble memory according to claim 4, wherein at least one of said inductance device and said capacitance device is constructed to change a reactance.

6. A series resonance drive circuit for a magnetic bubble memory, comprising:
 (a) a magnetic bubble memory chip in which magnetic bubbles are driven in accordance with a rotating magnetic field,
 (b) X and Y coils arranged orthogonally to each other to generate the rotating magnetic field in a plane of said magnetic bubble memory chip,
 (c) resonance capacitors each connected in series with respective one of said X and Y coils to form a series resonance circuit with the respective one of said X and Y coils at a frequency of said rotating magnetic field,
 (d) power supplies each connected to the respective one of said series resonance circuits to supply a cyclic wave current consisting of only an A.C. component to the respective one of said series resonance circuits, and
 (e) reactance means electrically connected to said series resonance circuits and for compensating a mutual inductance and a capacitance due to inductive and capacitive couplings between said X and Y coils, said reactance means including a variable inductor having one terminal connected in series with said X ayd Y coils, respectively and the other terminal grounded and a capacitor electrically connected between said series resonance circuits.

7. The series resonance drive circuit according to claim 6, wherein said variable inductor is adjusted to substantially cancel the inductive and capacitive coupling effects occurring between said X and Y coils.

* * * * *